(12) United States Patent
Ehling

(10) Patent No.: US 6,864,680 B2
(45) Date of Patent: Mar. 8, 2005

(54) METHOD AND APPARATUS FOR TUNING AN INPUT SIGNAL

(75) Inventor: Ernst Ehling, Neuhausen (DE)

(73) Assignee: Horst Siedle GmbH & Co., KG (DE)

( * ) Notice: Subject to any disclaimer, the term of this patent is extended or adjusted under 35 U.S.C. 154(b) by 21 days.

(21) Appl. No.: 10/327,067

(22) Filed: Dec. 24, 2002

(65) Prior Publication Data

US 2003/0122560 A1 Jul. 3, 2003

(30) Foreign Application Priority Data

Dec. 24, 2001 (EP) .............................................. 01130607

(51) Int. Cl.$^7$ ................................................. G01B 7/14
(52) U.S. Cl. ................................................. 324/207.13
(58) Field of Search ........................ 324/207.12, 207.13, 324/207.24; 330/278, 279, 110; 327/306, 308, 323, 324

(56) References Cited

U.S. PATENT DOCUMENTS

| | | | | |
|---|---|---|---|---|
| 4,943,773 A | * | 7/1990 | Koski et al. ............ | 324/207.13 |
| 5,334,933 A | * | 8/1994 | Tellerman ............... | 324/207.13 |
| 5,923,164 A | | 7/1999 | Ehling et al. .......... | 324/207.13 |
| 6,583,615 B1 | * | 6/2003 | Kathol ................... | 324/207.13 |

* cited by examiner

*Primary Examiner*—Jay Patidar
*Assistant Examiner*—Reena Aurora
(74) *Attorney, Agent, or Firm*—Harness, Dickey & Pierce, P.L.C.

(57) ABSTRACT

A method of tuning an input signal (S) is described. The method comprises the steps of amplifying the input signal (S) by a gain element (14) having a variable impedance (22) associated therewith and thereby generating an output signal (C), comparing the output signal (C) with a reference voltage (V), tuning the variable impedance (22) such that the impedance is increased if the amplitude of the output signal (C) is smaller than the reference voltage (V), and that the impedance is decreased if the amplitude of the output signal (C) is greater than the reference voltage (V).

28 Claims, 3 Drawing Sheets ly a single comparator is necessary to perform the tuning
METHOD AND APPARATUS FOR TUNING AN INPUT SIGNAL The present invention hereby claims priority under 35 U.S.C. §119 on European patent application number 01130607.3 filed Dec. 24, 2001, the entire contents of which are hereby incorporated by reference.

FIELD OF THE INVENTION

The present invention generally relates to a method and an apparatus for tuning an input signal.

BACKGROUND OF THE INVENTION

U.S. Pat. No. 5,923,164 describes a signal tuning apparatus including a gain element, a variable impedance and a control device. The gain element is an operational amplifier having an input for receiving an input signal to be tuned, and an output with an output signal. A feedback path extends from the output to the input. The variable impedance is provided in the feedback path for varying the gain of the operational amplifier. The variable impedance includes a plurality of resistors and a plurality of switches. The resistors are connected in series in the feedback path. Each of the resistors has a switch in parallel for switching the resistor into or out of the feedback path. The output signal of the operational amplifier is connected to the control device as an input signal. Based on this input signal, the control device generates a plurality of switching signals which are provided to the switches of the variable impedance. Furthermore, the control device receives a minimum reference voltage and a maximum reference voltage which represent a bandwidth for the output signal of the operational amplifier.

In operation, the signal tuning apparatus of U.S. Pat. No. 5,923,164 compares the output signal of the operational amplifier with the minimum and maximum reference voltage. If the output signal is smaller than the minimum reference voltage or greater than the maximum reference voltage, the gain of the operational amplifier is increased or decreased by switching appropriate resistors into or out of the feedback path of the operational amplifier. If the output signal is greater than the minimum reference voltage and smaller than the maximum reference voltage, then the gain of the operational amplifier is not changed. Thus, the output signal of the operational amplifier is held within the bandwidth defined by the minimum and maximum reference voltage.

SUMMARY OF THE INVENTION

An object of the present invention is to provide a method and an apparatus for tuning an input signal which is more accurate and requires less efforts.

According to an embodiment of the present invention, an input signal is tuned in dependence of a single reference voltage. Therefore, the input signal does not vary between two voltage levels but only toggles around the single reference voltage. As a result, the input signal more accurately remains at the voltage level of the reference voltage.

Furthermore, as only a single reference voltage is present, only a single comparator is necessary to perform the tuning the input signal.

The invention will be better understood from the following description taken in connection with the accompanying drawings.

DETAILED DESCRIPTION OF THE PREFERRED EMBODIMENTS

Figure 1:
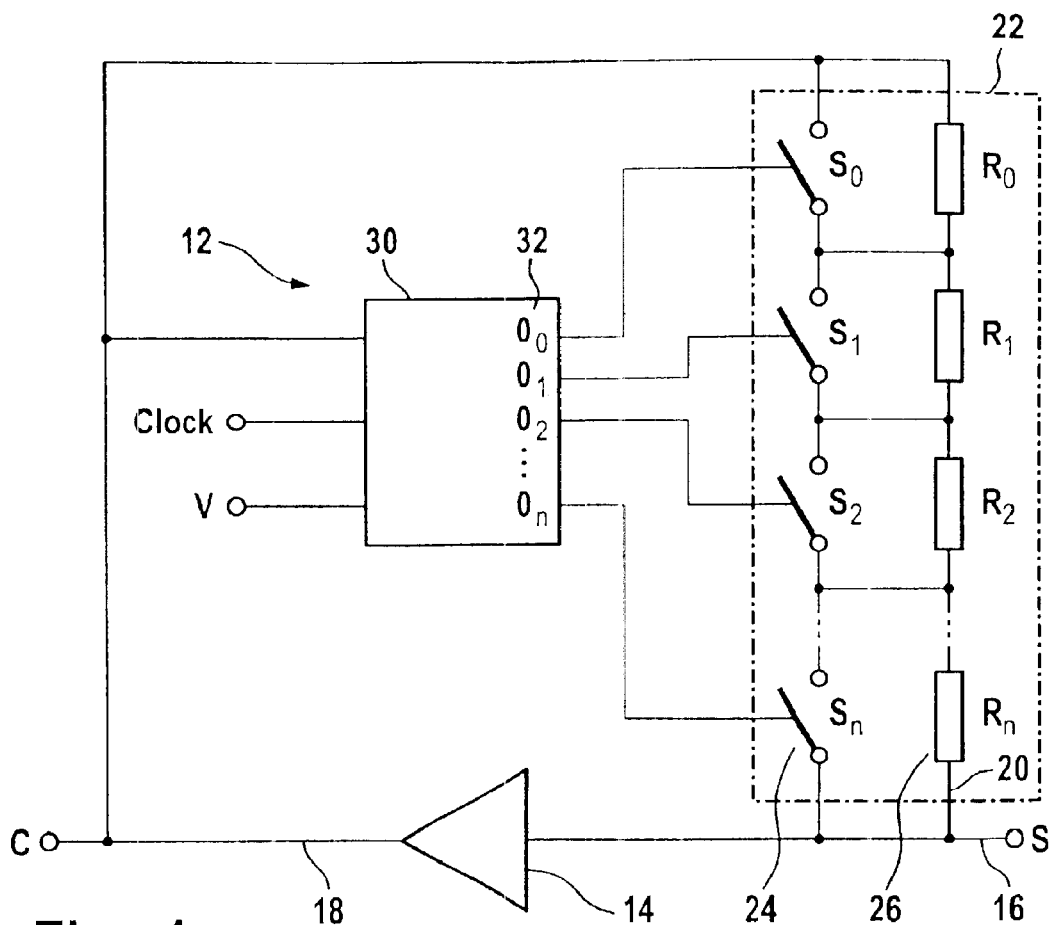
FIG. 1 is a schematic diagram of a signal tuning apparatus according to the invention.

FIG. 1 shows a signal tuning apparatus 12 including a gain element 14, a variable impedance 22 and a control device 30.

The gain element 14 is an operational amplifier provided with at least one input 16 and an output 18. The input 16 of the operational amplifier receives an input signal S which is the signal to be tuned. At the output 18 of the operational amplifier, an output signal C is available which is the tuned signal.

The output 18 of the gain element 14 is connected with its input 16 via a feedback path 20 which includes the variable impedance 22.

The variable impedance 22 comprises n+1 resistors 26 and n+1 switches 24. The resistors 26 are indicated by the abbreviations $R_0, R_1, R_2, \ldots, R_n$ and the switches 24 are indicated by the abbreviations $S_0, S_1, S_2, \ldots, S_n$, with n being any number greater than zero. The resistors 26 are connected in series in the feedback path 20. Each of the resistors 26 is provided with one of the switches 24 in parallel. If one of the switches 24 is closed, the corresponding resistor 26 is switched out of the feedback path 20. However, if one of the switches 24 is open, the respective resistor 26 is effective within the feedback path 20.

The output signal C is provided as an input signal to the control device 30. Furthermore, the control device 30 receives a reference voltage V and a clocking signal CLOCK as other input signals. The control device 30 generates n+1 binary switching signals 32 which are indicated by the abbreviations $O_0, O_1, O_2, \ldots, O_n$. Every one of the switching signals 32 is dedicated to one of the switches 24. Depending on the binary state of the switching signal 32, the corresponding switch 24 is open or closed.

The resistors 26 increase in resistance from $R_0$ to $R_n$ in a binary increasing fashion. Thus, $R_1$ has a resistance value of $2^1$ times $R_0$, $R_2$ has a resistance value of $2^2$ times $R_0$, and so on.

In FIG. 1, as an example, a number of eight resistors 26, i.e. $R_0$ to $R_7$, is provided with a resulting number of eight switches 24, i.e. $S_0$ to $S_7$, and eight switching signals 32, i.e. $O_0$ to $O_7$. The eight switching signals 32 may be seen as a digital value between the binary number "0000 0000" and the binary number "1111 1111", which correspond to the decimal numbers "0" and "256". Thus, any resistance value between $R_0$ and 256 times $R_0$ may be generated depending on the digital value of the switching signals 32.

In operation, the control device 30 compares the output signal C, i.e. the tuned signal, with the reference voltage V. This comparison is performed at every clocking signal CLOCK.

If the output signal C is greater than the reference voltage V, then the digital value of the switching signals 32 is decreased by one, i.e. by the binary number "0000 0001". If the output signal C is not greater than the reference voltage V, then the digital value of the switching signals 32 is increased by one, i.e. by the binary number "0000 0001".

Thus, if the output signal C is greater than the reference voltage V, then the resistance of the feedback path 20 is decreased thereby decreasing the gain of the gain element 14, and if the output signal C is not greater than the reference voltage V, then the resistance of the feedback path 20 is increased thereby increasing the gain of the gain element 14.

As a result, such decrease or increase of the gain of the gain element 14 is performed at every clocking signal CLOCK. If the output signal C is equal to the reference voltage V, then it is possible that the output signal C is alternatively decreased and increased with every clocking signal CLOCK.

Figure 1A:
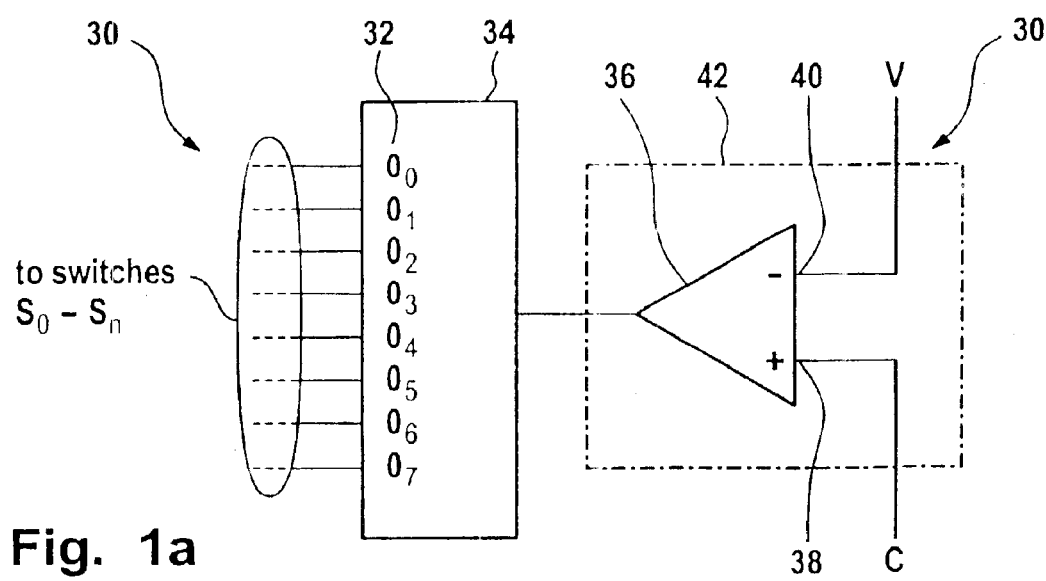
FIG. 1a is a schematic diagram of a control device comprised in the tuning apparatus of FIG. 1.

FIG. 1a shows the control device 30 of FIG. 1 in more detail. The control device 30 comprises a voltage evaluating element 42 and a signal generating circuit 34. The voltage evaluating element 42 comprises a comparator 36 which is supplied with the output signal C of the gain element 14 at a first input 38 and with the reference voltage V at a second input 40. The comparator 36 generates an output signal which is supplied to the signal generating circuit 34. The signal generating circuit 34 generates the eight switching signals 32, i.e. $O_0$ to $O_7$, which are supplied to the eight switches 24, i.e. $S_0$ to $S_7$. The generation of the eight switching signals 32 is performed in dependence of the output signal generated by the comparator 36 and supplied to the signal generating circuit 34.

Figure 2:
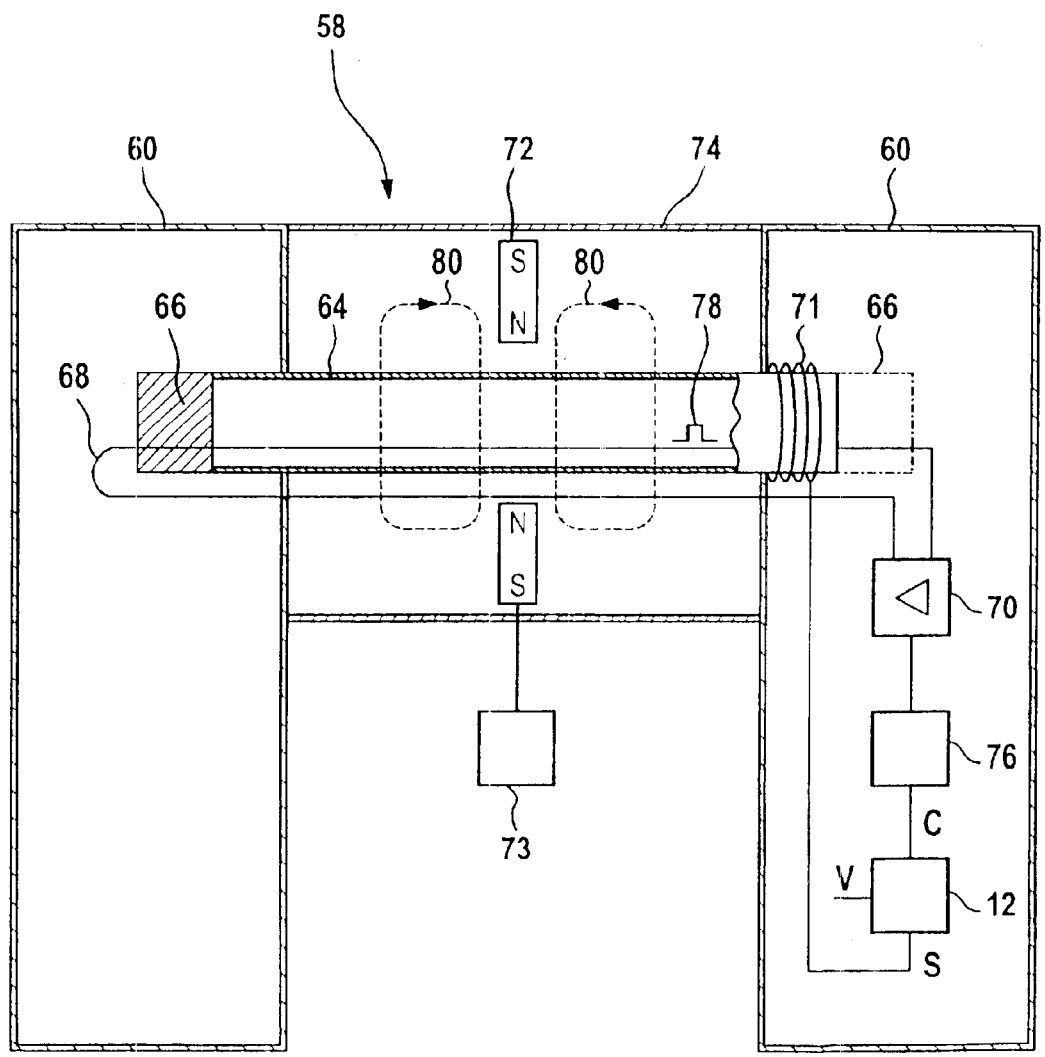
FIG. 2 is a schematic diagram of a magnetostrictive displacement transducer incorporating the signal tuning apparatus of FIG. 1.

FIG. 2 shows a magnetostrictive linear displacement transducer 58 incorporating the signal tuning apparatus 12 of FIG. 1. The transducer 58 includes housing members 60, a waveguide 64, a coil 71 and a magnet 72.

The waveguide 64 is made of magnetostrictive material and is tubular in shape. The coil 71 is located proximate to one of the two ends of the waveguide 64. The other one of the two ends of the waveguide 64 is provided with damping material 66. In addition, the end of the waveguide 64 which is located proximate to the coil 71 may also comprise damping material 66.

The coil 71 surrounds the waveguide 64 without being in contact with it. The magnet 72 is disposed linearly along the waveguide 64 and is connected to an object 73 such that the position of the magnet 72 along the waveguide 64 corresponds to the position of the object 73.

A conductive wire 68 is connected to a pulse generator 70. The conductive wire 68 extends through the interior of the entire length of the waveguide 64 and returns to the pulse generator 70 on the exterior of the waveguide 64. The waveguide 64, the conductive wire 68, the coil 71 and the magnet 72 are contained in an outer tube 74.

As an alternative, it is possible that the waveguide 64 and the conductive wire 68 are combined into a single wire.

The coil 71 is connected with the signal tuning apparatus 12 wherein the signal received by the signal tuning apparatus 12 is the input signal S to be tuned. The signal tuning apparatus 12 is connected to a displacement determination device 76 wherein the output signal C provided by the signal tuning apparatus 12 is the tuned signal. Furthermore, the displacement determination device 76 is connected to the pulse generator 70.

In operation, the pulse generator 70 periodically generates a single excitation pulse 78 on the conductive wire 68 exactly every e.g. 2 milliseconds. The excitation pulse 78 passes through the conductive wire 68 and combines with the magnetic field of the magnet 72. Thus, a torsion wave 80 is created within the waveguide 64 which propagates away from the magnet 72 and back to the coil 71. When the torsion wave 80 reaches the coil 71, it is converted into the signal S.

The production of the excitation pulse 78 is also transmitted to the displacement determination device 76.

The signal S from the coil 71 is passed to the signal tuning apparatus 12 where it is tuned to the reference voltage V as described in connection with FIG. 1. Then, the displacement determination device 76 receives the tuned signal C and measures the interval of time between the production of the excitation pulse 78 and the receipt of the tuned signal C. Using the interval of time and the known speed of the torsion wave 80 within the waveguide 64, the displacement determination device 76 is able to determine the position of the object 73.

Figure 3:
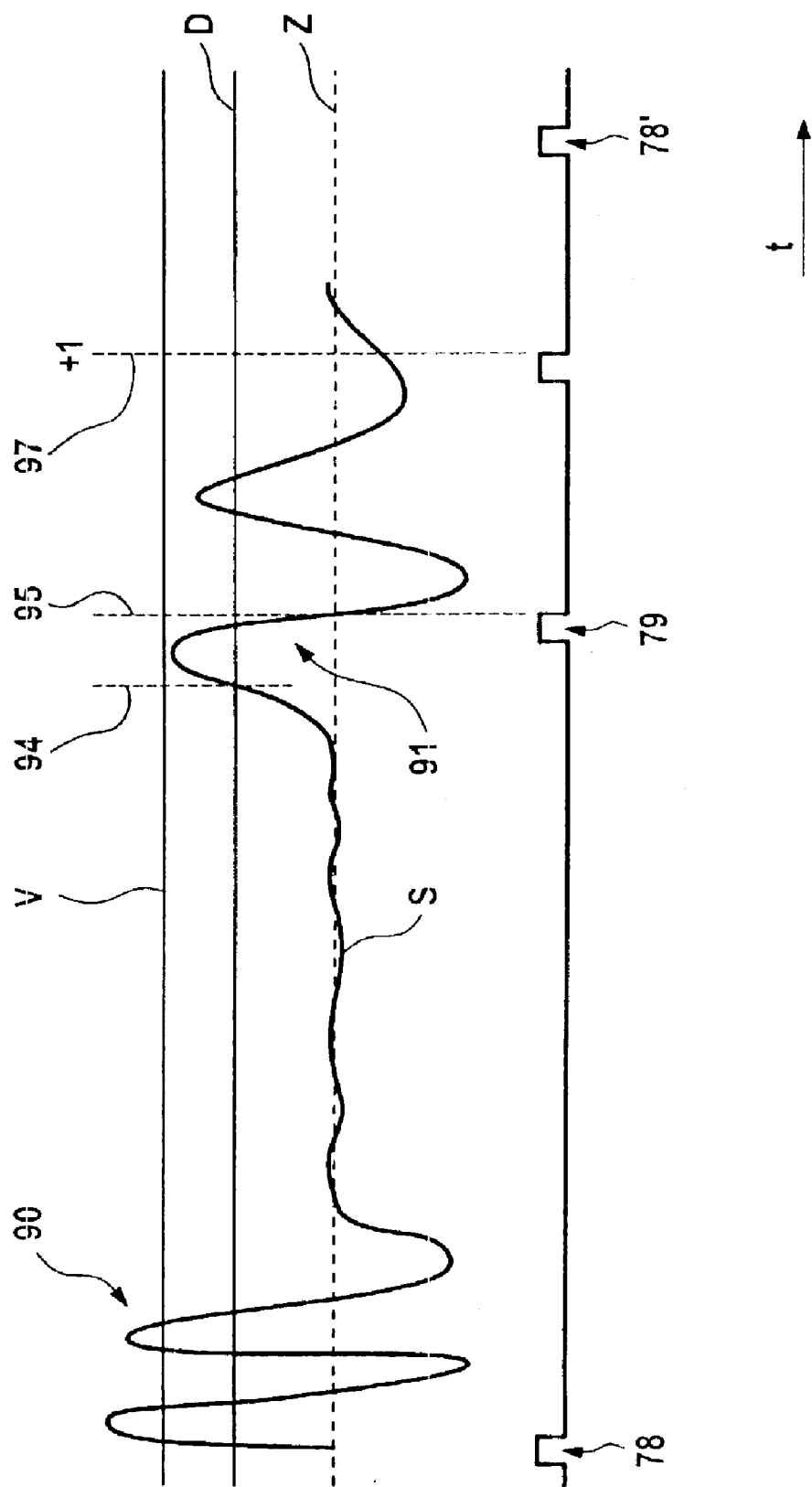
FIG. 3 is a schematic diagram of a signal to be tuned by the signal tuning apparatus of FIG. 1.

FIG. 3 shows the input signal S to be tuned by the signal tuning apparatus 12 of FIG. 2. Furthermore, FIG. 3 shows the excitation pulse 78 and the reference voltage V. All signals and pulses shown in FIG. 3 are depicted over the time t.

As described in connection with FIG. 2, the excitation pulse 78 is generated and transmitted through the waveguide 64. On its way along the waveguide 64, the excitation pulse 78 passes through the coil 71. There, the excitation pulse 78 creates some disturbances of the signal S which are depicted by the reference numeral 90 in FIG. 3. These disturbances are taken into consideration neither by the signal tuning apparatus 12 nor by the displacement determination device 76.

As described in connection with FIG. 2, the torsion wave 80 is created and is converted into the signal S. This leads to a deflection of the signal S which is depicted by the reference numeral 91 in FIG. 3. This deflection is recognised by the signal tuning apparatus 12 and the displacement detection device 76 as described below.

The signal tuning apparatus 12 receives the signal S and performs the tuning of the signal S as described in connection with FIG. 1. However, this tuning of the signal S is not performed at once but at a later point in time as described below.

The displacement detection device 76 receives the tuned signal C and performs the evaluation of the position of the object 73 as described in connection with FIG. 2.

For that purpose, in a first step, the displacement detection device 76 detects that point in time when the signal S becomes greater than a detection voltage D. This point in time is depicted with the reference numeral 94 in FIG. 3. The detection voltage D serves to recognise the deflection of the signal S created by the torsion wave 80 as described in connection with FIG. 2.

As shown in FIG. 3, the detection voltage D is smaller than the reference voltage V but greater than a zero voltage Z. The zero voltage Z is that voltage which is present as the input signal S when no excitation pulses 78 or other signals are passed through the conductive wire 68.

Then, in a second step, the displacement determination device 76 detects that point in time when the signal S becomes equal to the zero voltage Z. In FIG. 3, this point in time is depicted with the reference numeral 95. It shall be emphasised that the described detection is performed subsequently after the signal S becomes greater than the detection voltage D so that the point in time 95 is that point in time when the signal S becomes equal to the zero voltage Z for the first time after the point in time 94.

The displacement determination device 76 generates a response pulse 79 depending on the point in time 95. As shown in FIG. 3, the falling edge of the response pulse 79 corresponds to the point in time 95. The interval of time between the excitation pulse 78 and the response pulse 79 is then used by the displacement determination device 76 to evaluate the position of the object 73 as described in connection with FIG. 2.

The signal tuning apparatus 12 receives the signal S. Similar to the description above, the signal tuning apparatus 12 detects the point in time 94. Subsequently, the signal tuning apparatus 12 checks whether the signal S becomes greater than the reference voltage V. In the case of the signal S as shown in FIG. 3, the signal tuning apparatus 12 recognises that the signal S does not become greater than the reference voltage V. Therefore, the signal tuning apparatus 12 increases the gain of the gain element 14 by "+1", i.e. by $R_0$ as described in connection with FIG. 1.

As already mentioned, the tuning of the signal S is not performed at once but at a later point in time. As shown in FIG. 3, the tuning of the signal S, i.e. the increase of the gain of the gain element 14 by "+1" is performed in a point in time which is depicted with the reference numeral 97. This point in time 97 is located after the response pulse 79 and prior to the next excitation pulse 78'.

In particular, the tuning of the signal S is not performed between the excitation pulse 78 and the response pulse 79, i.e. during the time interval which is used by the displacement detection device 76 to evaluate the position of the object 73. Therefore, this evaluation of the position of the object 73 cannot be negatively influenced by the tuning of the signal S. As well, the tuning of the signal S is not performed shortly before the next excitation signal 78'. Therefore, the tuning of the signal S cannot have any negative influence on the next excitation pulse 78' and the resulting torsion wave 80.

Instead, the tuning of the signal S is performed at the point in time 97 such that any resulting change of the gain of the gain element 14 does not have any impact on the evaluation of the position of the object 73. In particular, the point in time 97 is selected such that any oscillation of the signal S due to the change of the gain of the gain element 14 has finished prior to the next excitation signal 78'.

As described in connection with FIG. 2, the excitation pulse 78 is generated exactly every e.g. 2 milliseconds. The interval of time between the excitation pulse 78 and the response pulse 79 is less than 2 milliseconds. Therefore, due to the fixed periodic generation of the excitation pulse 78, it is possible to select a fixed point in time 79 for the tuning of the signal S, which is outside the interval of time between the excitation pulse 78 and the response pulse 79. In particular, it is possible to define the point in time 97 as a fixed time interval prior to the excitation pulse 78.

As a result, the clocking signal CLOCK as described in connection with FIG. 1 may be selected with the identical periodic repetition as the excitation pulse 78, but with a fixed displacement with respect to the excitation pulse 78 which is identical to the aforementioned fixed time interval prior to the excitation pulse 78.

What is claimed is:

1. A method of tuning a torsion wave input signal, comprising:
    torsion wave input signal by a gain element having a variable impedance associated therewith and thereby generating an output signal;
    comparing the output signal with a reference voltage;
    tuning the variable impedance such that the impedance is increased if the amplitude of the output signal is smaller than the reference voltage, and that the impedance is decreased if the amplitude of the output signal is greater than the reference voltage.

2. The method of claim 1, further comprising:
    generating an excitation pulse, having the excitation pulse pass through a conductive wire;
    creating a torsion wave by having the excitation pulse pass a magnetic field of a magnet being located along the conductive wire; and
    converting the torsion wave and thereby creating the torsion wave input signal.

3. The method of claim 2, further comprising:
    measuring an interval of time between the generation of the excitation pulse and the conversion of the torsion wave input signal; and
    evaluating the position of the magnet along the conductive wire based on this interval of time.

4. The method of claim 3, wherein the step of tuning the torsion wave input signal is performed after the conversion of the input signal and prior to the generation of the next excitation pulse.

5. The method of claim 3, wherein the step of tuning the torsion wave input signal is not performed between the generation of the excitation pulse and the conversion of the input signal.

6. The method of claim 4, where in the step of tuning the torsion wave input signal is not performed shortly before the generation of the next excitation pulse.

7. The method of claim 4, wherein the step of tuning the torsion wave input signal is performed at a fixed time interval prior to the generation of the next excitation pulse.

8. The method of claim 1, wherein the reference voltage is a single reference voltage.

9. The method of claim 1, wherein the impedance is decreased each time it is determined, based upon the comparison, that the amplitude of the output signal is greater than the reference voltage.

10. A signal tuning apparatus, comprising:
    a gain element for amplifying a torsion wave input signal and for generating an output signal, said gain element having a variable impedance associated therewith; and
    a control device for comparing the output signal with a reference voltage and for tuning the variable impedance such that the impedance is increased if the amplitude of the output signal is smaller than the reference voltage, and that the impedance is decreased if the amplitude of the output signal is greater than the reference voltage.

11. The signal tuning apparatus of claim 10, wherein said control device includes a comparator for comparing the output signal with the reference voltage and a signal generating circuit for generating switching signals to influence the impedance for the variable impedance.

12. A magnetostrictive displacement transducer, comprising:
    a pulse generator for generating an excitation pulse;
    a conductive wire coupled with the pulse generator having the excitation pulse pass through the conductive wire;
    a magnet being located along the conductive wire for creating a torsion wave if the excitation pulse passes the magnetic field of the magnet;
    a coil for converting the torsion wave and thereby creating the torsion wave input signal; and
    a signal tuning apparatus according to claim 8.

13. The magnetostrictive displacement transducer of claim 12 further comprising:
    a displacement determination device for measuring an interval of time between the generation of the excitation pulse and the conversion of the torsion wave input signal and for evaluating the position of the magnet along the conductive wire based on this interval of time.

14. The magnetostrictive displacement transducer of claim 13, wherein tuning the input signal is performed after the conversion of the torision wave input signal and prior to the generation of a next excitation pulse.

15. The magnetostrictive displacement transducer of claim 13, wherein tuning the torsion wave input signal is not performed between the generation of the excitation pulse and the conversion of the input signal.

16. The magnetostrictive displacement transducer of claim 14, wherein tuning the torsion wave input signal is not performed shortly before the generation of the next excitation pulse.

17. The magnetostrictive displacement transducer of claim 14, wherein tuning the torsion wave input signal is performed at a fixed time interval prior to the generation of the next excitation pulse.

18. The apparatus of claim 10, wherein the reference voltage is a single reference voltage.

19. The apparatus of claim 10, wherein the impedance is decreased each time it is determined, based upon the comparison, that the amplitude of the output signal is greater than the reference voltage.

20. An apparatus for tuning a torsion wave input signal, comprising:

means for amplifying the torsion wave input signal by a gain element having a variable impedance associated therewith and thereby generating an output signal;

means for comparing the output signal with a reference voltage; and means for tuning the variable impedance such that the impedance is increased if the amplitude of the output signal is smaller than the reference voltage, and that the impedance is decreased if the amplitude of the output signal is greater than the reference voltage.

21. The apparatus of claim 20, further comprising:

means for generating an excitation pulse, having the excitation pulse pass through a conductive wire;

means for creating a torsion wave by having the excitation pulse pass a magnetic field of a magnet being located along the conductive wire; and means for converting the torsion wave and thereby creating the torsion wave input signal.

22. The apparatus of claim 21, further comprising:

means for measuring an interval of time between the generation of the excitation pulse and the conversion of the torsion wave input signal; and means for evaluating the position of the magnet along the conductive wire based on this interval of time.

23. The apparatus of claim 22, wherein tuning of the torsion wave input signal is not performed between the generation of the excitation pulse and the conversion of the torsion wave input signal.

24. The apparatus of claim 22, wherein tuning of the torsion wave input signal is performed at a fixed time interval prior to the generation of the next excitation pulse.

25. The apparatus of claim 22, wherein tuning of the torsion wave input signal is performed after the conversion of the torsion wave input signal and prior to the generation of the next excitation pulse.

26. The apparatus of claim 25, wherein tuning of the torsion wave input signal is not performed shortly before the generation of the next excitation pulse.

27. The apparatus of claim 20, wherein the reference voltage is a single reference voltage.

28. The apparatus of claim 20, wherein the impedance is decreased each time it is determined, based upon the comparison, that the amplitude of the output signal is greater than the reference voltage.

* * * * *